250/203 260

Oct. 5, 1965 S. R. MORRISON 3,210,548

SEMICONDUCTOR LIGHT POSITION INDICATORS AND SCANNERS

Filed Nov. 15, 1962 2 Sheets-Sheet 1

INVENTOR
STANLEY R. MORRISON

BY Francis A. Sirr

ATTORNEY

SEMICONDUCTOR LIGHT POSITION INDICATORS AND SCANNERS
Filed Nov. 15, 1962 2 Sheets-Sheet 2
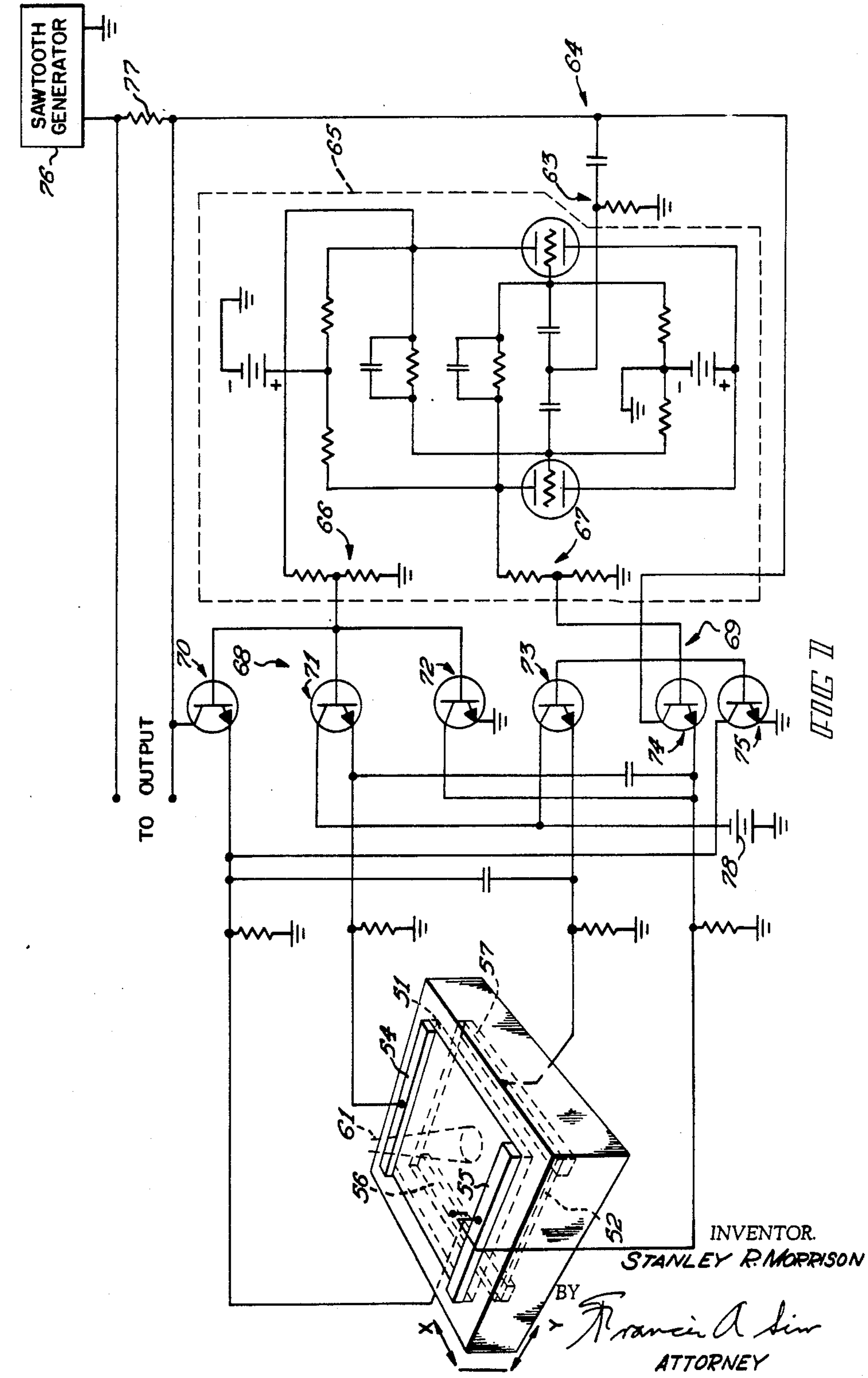
FIG II

United States Patent Office

3,210,548
Patented Oct. 5, 1965

3,210,548
SEMICONDUCTOR LIGHT POSITION INDICATORS AND SCANNERS

Stanley R. Morrison, Hopkins, Minn., assignor to Honeywell Inc., a corporation of Delaware
Filed Nov. 15, 1962, Ser. No. 237,892
8 Claims. (Cl. 250—211)

The present application is related to pending application Serial No. 205,422 in the name of Stanley R. Morrison, filed June 26, 1962, and assigned to the same assignee.

The present invention is directed to light sensitive semiconductor devices and is based on the concept that reverse biased PN junctions, or the like, in semiconductors are capable of passing current when exposed to light. More particularly, the various embodiments of the present invention produce a characteristic output that is related to the position and intensity of incident light falling on a reverse biased junction or on a junction, a portion of which is reverse biased. Thus, it can be seen that the present invention is directed to light scanners, light position indicators, and the like.

An object of this invention is to provide improved semiconductive light scanners and read out devices for use either singularly or in array.

Another object of this invention is to provide one-dimensional light position indicators and the necessary accompanying circuitry.

A further object of this invention is to provide a two-dimensional light position indicator and the necessary accompanying circuitry.

Another object of this invention is to provide improved and greatly simplified light sensitive devices of the above described character which are simpler to fabricate than prior art devices.

Generally, an embodiment of a device in accordance with the present invention consists of a base of one conductivity type having two spaced regions of another conductivity type place thereon to form two junction areas. An ohmic contact is placed at each end of one region and a steady state voltage is applied to establish a potential gradient ($V_{min}$–$V_{max}$) thereacross. To the second region, a sweeping voltage source, such as a sawtooth generator, is connected through an ohmic contact. In operation, the sawtooth generator provides a cycling potential which electronically scans the junction formed by the first region, and in each cycle of scanning, incident illumination on one of the junctions is observed as a function of distance along the length of the junction and the intensity of the incident light thereon.

The invention will be described in greater detail by reference to the following description taken in connection with the accompanying drawings, in which:

FIGURE 7 is a perspective and schematic view of the two-dimensional light position indicator of FIGURES 4, 5, and 6 in combination with an associated circuit according to the present invention.

Figure 1:
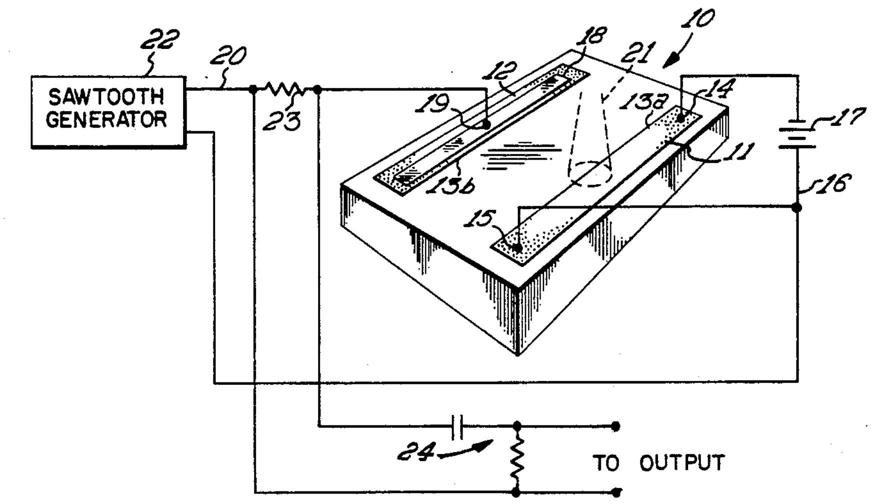
FIGURE 1 is a perspective and schematic view of a light scanner or one-dimensional light position indicator and associated circuit in accordance with the present invention.

Referring now to FIGURE 1, a light scanner or one-dimensional light position indicator is disclosed consisting of a high resistivity base region 10 of one conductivity type, with regions 11 and 12 of another conductivity type forming junctions 13*a* and 13*b* thereon. Base region 10 may consist of any semiconductive material such as silicon, germanium, or the like. For purposes of the present illustration, assume base region 10 is of a P-type silicon. Regions 11 and 12 may be any semiconductive material of a conductivity type which forms a rectifying junction with the material utilized for the base region 10. Assume that phosphorous has been diffused into region 10 to form N-type regions 11 and 12 and junctions 13*a* and 13*b* respectively.

Region 11 is shown contacted by ohmic electrodes 14 and 15 at opposite ends thereof. Electrodes 14 and 15 are in turn associated with circuit 16 containing a potential source or voltage input such as, battery 17, which is utilized to provide a steady state potential gradient across region 11 between electrodes 14 and 15.

Region 12 is shown contacted by a conductive layer 18, such as a metal coating, which makes region 12 equipotential. Of course, other means are available for rendering region 12 equipotential, such as the application of a high load resistance in the external circuit which makes the potential drop along region 12 negligible. Other means for rendering region 12 equipotential will be obvious to those skilled in the art, although it is not necessary that region 12 be exactly equipotential in order for the device to operate properly in accordance with the present invention. Region 12 is contacted by a single ohmic electrode 19 which is associated in external circuit 20 with a cycling, sweeping voltage source, such as sawtooth generator 22. Current measuring means, such as resistor 23 is shown connected between sawtooth generator 22 and ohmic electrode 19 for the purpose of measuring variations in the current applied to region 12. A simple differentiating circuit, generally designated as 24, is shown connected across resistor 23. The function of the differentiating circuit 24 is to electronically locate the position of incident light on region 11 with respect to the length of the region and will be explained in greater detail below.

In operation, the device functions as follows:

Assume that a light spot 21, the position of which corresponds to a potential, intermediate between $V_{min}$–$V_{max}$, is located on region 11. Considering only one cycle of sawtooth generator 22, the potential applied to region 12 sweeps from $V_{min}$ to $V_{max}$. At any one instant before reaching a value corresponding to the position of light spot 21, the sweeping potential applied to the region 12 will correspond to a potential value at some point along the potential gradient of the region 11 below the position of light 21. For the area along both regions above this potential value, the potential of region 11 will be greater than the potential of region 12. Therefore, junction 13*a* of region 11 will be forward biased and junction 13*b* of region 12 will be reverse biased. In this particular area, no current can pass between the two regions. For the area along regions 11 and 12 below this potential value, region 12 will have the higher potential. This means that the junction 13*b* will be forward biased and junction 13*a* will be reverse biased. Hence, in this particular area, there will be no current flow between regions 11 and 12. In other words, as the sweeping potential scans region 11 during each cycle, a forward bias progressively forms along the length of region 12 and progressively diminishes the length of the reverse bias thereupon. Also, a reverse bias progressively forms along the length of region 11 and progressively diminishes the length of the forward bias thereupon.

When the sweeping potential reaches the potential value corresponding to the position of light spot 21 on the region 11, current will begin to flow between regions 11 and 12, since light spot 21 places reverse biased junction 13*a* of region 11 in a leaky condition. The flow of current continues for the remainder of the cycle and the amount of current is dependent on the intensity of light spot 21. Thus, it can be seen that the device can be electronically scanned to locate light spot 21.

As previously stated, the total current flowing through junction 13*a* at the position of light spot 21 is a function of the intensity of the light incident thereon. The scanning time of each cycle of sawtooth generator 22 is related to the distance along region 11. Thus, it can be seen that these two parameters are equivalent to $\int I dx$, where I indicates intensity and $dx$ indicates length along region 11. Hence, it can be seen that the derivative of the current applied to region 12 (measured by the drop across resistor 23) will be the intensity as a function of distance along region 11. Hence, a simple differentiating circuit, such as 24, can be utilized to read the position of light spot 21 on region 11.

In the example discussed above, light spot 21 was incident upon region 11. The device is also capable of operating if light spot 21 is incident upon region 12. In the first case, current does not flow between regions 11 and 12 until the sweeping potential has reached a value corresponding to the position of light spot 21 on region 11. Whereas, if the light spot 21 is located on region 12, current will flow into region 12 until the sweeping potential reaches a value corresponding to the location of light spot 21. At that time, the current flow will cease for the remainder of the cycle. This aspect of the present invention is utilized in the embodiment disclosed hereinbelow.

It is also important to note that the smallest dimension allowable between regions 11 and 12 is determined essentially by the diffusion length of the minority carriers. Since minority carriers are not inhibited by the same reverse bias at a junction which inhibits majority carriers, it is necessary that the junctions be positioned greater than one diffusion length distant from each other for the minority carriers to inhibit their transport. The largest dimension allowable is related to the resistivity of the base silicon, and therefore the base silicon should be of high resistivity to allow reasonable dimensions.

Figure 2:
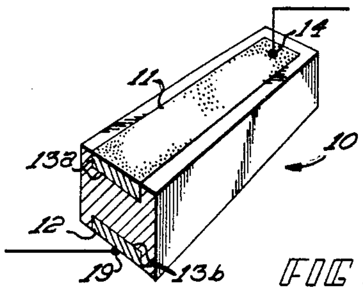
FIGURE 2 is a schematic cross-sectional view of a light scanner or one-dimensional light position indicator in a preferred embodiment in accordance with the present invention.

Referring now to FIGURE 2, another form of a light scanner or one-dimensional light position indicator in accordance with the present invention is disclosed. For clarity of illustration, only one-half of the semi-conductor portion of the device is shown in cross-section. In this embodiment, regions 11 and 12 are positioned on opposite surfaces of base 10. Since it is necessary that only one of the junctions be exposed to light, regions 11 and 12 may be positioned on opposite surfaces of base 10 to make a more compact device with a wider range of application. Elements of the device disclosed in FIGURE 2 are similarly numbered to correspond to those disclosed in FIGURE 1. It is obvious that the device, when connected into the same type of circuit, will function in an identical manner.

Figure 3:
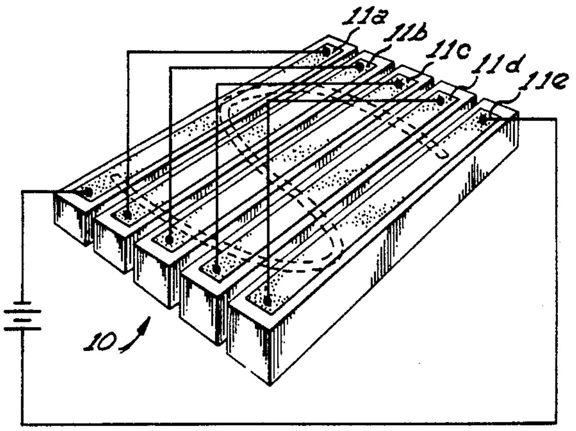
FIGURE 3 is a perspective and schematic view of an array of the devices shown in FIGURE 2, in accordance with the present invention, illustrating another configuration of the light scanner which may be utilized as a reading device.

Reference is now made to FIGURE 3, in which another embodiment of a device in accordance with the present invention is disclosed. This embodiment shows that an array of the devices of FIGURE 2 will function as a reading device. When a plurality of the devices of FIGURE 2 are connected in parallel, as shown, a large light sensitive surface is formed. Regions 11*a*, 11*b*, 11*c*, 11*d*, and 11*e* are connected in series. On the opposite surface of base region 10, corresponding regions 12*a*, 12*b*, 12*c*, 12*d* and 12*e* are connected in parallel. Connected into a circuit similar to that of FIGURE 1, the illumination of a letter, "S" for example, will cause an output peculiar to that particular light configuration when the entire array is electronically scanned. A different letter will cause a different series of outputs and a computer can easily distinguish between the various series of outputs corresponding to the various letters of the alphabet, numbers, or other desired configurations.

Figure 4:
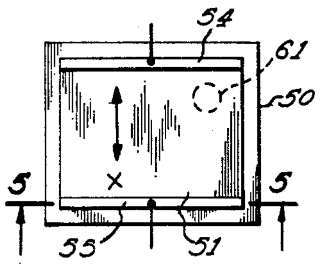
FIGURE 4 is a top view of a two-dimensional light position indicator in accordance with the present invention.
Figure 5:
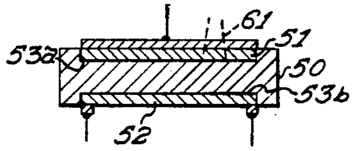
FIGURE 5 is a cross-sectional view of FIGURE 4 showing the two-dimensional light position indicator.
Figure 6:
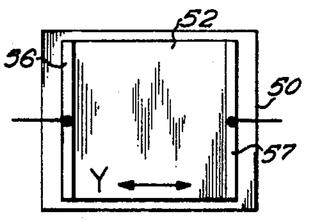
FIGURE 6 is a bottom view of the two-dimensional indicator of FIGURE 4 in accordance with the present invention.

Reference is now made to FIGURES 4, 5, 6 and 7. These figures disclose another embodiment in accordance with the present invention, in which the principle of the light scanner and one-dimensional light position indicator are expanded to include a two-dimensional light position indicator for indicating the two coordinates of a light spot in an area. FIGURES 4, 5 and 6 show a top view, cross-section, and bottom view respectively, of the semiconductor body in accordance with this aspect of the present invention. 50 designates the base region, which may by P-type silicon, for example. Regions 51 and 52, generally rectangular in configuration, are positioned on opposite surfaces of base region 50, as in the previous embodiments, to form junctions 53*a* and 53*b* respectively. Assume that these regions are N-type as in the other disclosed embodiments. Ohmic electrodes 54 and 55 are attached on opposite edges of region 51. Ohmic electrodes 56 and 57 are also attached at opposite edges of region 52, but are placed at right angles to electrodes 54 and 55. Taking into consideration the positioning of the electrodes on each face of the device, applied current will be in the X-direction over one face and the Y-direction over the other face as shown in FIGURES 4 and 6. Placing a steady state potential gradient from source 78 across region 51 in the X-direction and a cycling, sweeping voltage, such as a sawtooth generator 76, across region 52 in the Y-direction will enable the X-coordinate of a light spot on region 51 to be located as a particular output value along the potential gradient on region 51. In other words, the position of the light spot on region 51 will be sensed as a function of distance along the potential gradient applied to the region. As in the other embodiments, when the voltage of the sawtooth generator on region 52 becomes equal to the voltage at the position of the light spot along the potential gradient on region 51, a pulse will result in the derivative of the current applied to region 52. This pulse will indicate the X-coordinate of the light spot on region 51.

Thus, after one sweep of sawtooth generator 76, the relative roles of regions 51 and 52 are reversed by connecting electrodes 54 and 55 to sawtooth generator 76 and electrodes 56 and 57 to steady state potential source 78. By reasoning similar to that above for determining the X-coordinate, the Y-coordinate is determined by electronic scanning without the necessity of turning the entire device to expose region 52 to light spot 61.

FIGURE 7 shows the two-dimensional indicator and a preferred electrical circuit for controlling the operation of the device. The circuit generally consists of a bistable flip flop circuit means, generally designated as 65, having two stable conditions of operation, two output points 66 and 67 and one input point 64. This type of circuit is well known in the art as evidenced by its disclosure in Electronic Circuits and Tubes, McGraw-Hill, 1947, page 850. Connected between input point 64 and flip flop circuit 65 is a differentiating circuit 63, the function of which is the same as disclosed above in FIGURE 1 and identified as 24. Two sets of transistors, generally designated as 68 and 69 are shown connected to output points 66 and 67 respectively. Each set is activated in one of the stable conditions of flip flop circuit 65.

Set 68 contains three transistors designated as 70, 71, and 72 respectively. The emitter of transistor 70 is connected to electrode 56; the emitter of transistor 71 is connected to electrode 54; and the collector of transistor 72 is connected to electrode 55.

Set 69 also contains three transistors designated as 73, 74, and 75 respectively. The emitter of transistor 73 is connected to electrode 57; the emitter of transistor 74 is connected to electrode 55; and the collector of transistor 75 is connected to electrode 56.

Sawtooth generator 76 is shown connected to the collector of transistor 70, input point 64 of flip flop circuit 65, and the collector of transistor 74. Current measuring means, such as resistor 77, is connected between sawtooth generator 76 and input point 64. A steady state potential source 78 is shown connected to the collector of transistor 71 and the collector of transistor 73.

The combination functions as follows:

Assume light spot 61 is illuminating a portion of region 51. Flip flop circuit 65 is alternately placed in one and then the other of its stable conditions by successive cycles of sawtooth generator 76, thus activating and deactivating the transistor sets 68 and 69.

Assume during one cycle, that flip flop 65 is in the first stable condition which activates transistor set 68 and deactivates transistor set 69. In this condition, the base of transistor 71 completes the circuit between the emitter and collector thereof, thus connecting potential gradient source 78 to electrode 54 and applying a potential gradient across region 51. The base of transistor 70 completes the circuit between the emitter and collector thereof, thus connecting sawtooth generator 76 to electrode 56 and applying a sweeping potential across region 52. When the sweeping voltage reaches a value equal to that corresponding to the position of light beam 61 on the potential gradient across region 51, current will flow from region 52 through junction **53*a* and into region 51. The amount of current flowing serves as an indication of the X-coordinate of light beam 61 on region 51 as discussed herein above. Since the base of transistor 72 has completed the circuit between the collector and emitter thereof, this current will have a return path through electrode 55 and transistor 72 to ground. The increase in current flow will be reflected across resistor 77** and sensed as an output on an oscilloscope or the like.

During the successive cycle of sawtooth generator 76, the roles of regions 51 and 52 are reversed. Flip flop circuit 65 is placed in the second stable condition which activates transistor set 69 and deactivates transistor set 68. In this condition, the base of transistor 73 completes the circuit between the emitter and collector thereof, thus connecting potential gradient source 78 to electrode 57 and applying a potential gradient across region 52. The base of transistor 74 completes the circuit between the emitter and collector thereof, thus connecting sawtooth generator 76 to electrode 55 and applying a sweeping potential across region 51. When the sweeping voltage reaches a value equal to that corresponding to the position of light spot 61 on region 51, current will cease flowing from region 51 through junction **53*b* and into region 52. This will be an indication of the Y-coordinate of the light spot 61. This change in current flow will also be reflected across resistor 77 and sensed as an output on an oscilloscope or the like. Thus, it can readily be seen that the combination of FIGURE 7, in accordance with the present invention, will locate the two coordinates of a light beam shown in an area, each of the coordinates being sensed on successive cycles of sawtooth generator 76**.

It is to be understood that the present invention is not limited to those materials which are sensitive to visible light only. The wave length response can be varied by using other semiconductors. For example, a device in accordance with the present invention composed of indium antimonide or the like will extend the operation of the device into the far infra-red wave length region while germanium may be utilized for the near infra-red region. Other materials which will extend devices in accordance with the present invention to other desired wave lengths, will be obvious to those skilled in the art.

What is claimed is:

1. In combination, a light sensitive semiconductor device including a high resistivity base of one conductivity type having disposed thereon first and second spaced regions of another conductivity type forming first and second junction areas spaced apart by at least one minority carrier diffusion length; two spaced electrodes forming ohmic contacts to said first region; means for applying a steady state potential gradient across said first region between said contacts; an electrode forming an ohmic contact to said second region; and means for applying a variable potential between said ohmic contact on said second region and one of said ohmic contacts on said first region, said potential being capable of varying from the minimum value to the maximum value of said potential gradient applied across said first region; said device being further characterized in that it is constructed and arranged to receive light on a portion thereof.

2. In combination, a light sensitive semiconductor device including a high resistivity base of one conductivity type having disposed thereon first and second elongated regions of another conductivity type forming first and second junction areas spaced apart by at least one diffusion length for minority carriers; two spaced electrodes forming ohmic contacts to said first region; means for applying a steady state potential gradient across said first region between said spaced electrodes; an electrode forming an ohmic contact to said second region; means for applying a cycling, sweeping voltage between said ohmic contact on said second region and one of said ohmic contacts on said first region, each cycle of said voltage sweeping from the minimum value to the maximum value of said potential gradient applied to said first region and establishing inversely progressing incremental reverse biases on said junction areas, thus impeding the passage of current therethrough; one of said junction areas being designed to receive light on at least a portion thereof, said light maintaining said portion of said junction area in a leaky condition to allow the passage of current therethrough; and current measuring means electrically connected between said electrode on said second region and said sweeping voltage means for measuring current flow through said light receiving junction area, said current flow being related to the position and intensity of said light on said light receiving junction area.

3. In combination, a light sensitive semiconductor device including a high resistivity base of one conductivity type having disposed thereon first and second regions of another conductivity type forming first and second junction areas spaced apart by at least one diffusion length for minority carriers, said second region being further characterized in that it is equipotential; two spaced electrodes forming ohmic contacts to said first region; means for applying a steady state potential gradient across said first region between said spaced electrodes; an electrode forming an ohmic contact to said second region; means for applying a cycling, sweeping voltage between said ohmic contact on said second region and one of said ohmic contacts on said first region, each cycle of said voltage sweeping from the minimum value to the maximum value of said potential gradient applied to said first region and establishing inversely progressing incremental reverse biases on said junction areas, thus impeding the passage of current therethrough; one of said junction areas being designed to receive light on at least a portion thereof, said light maintaining said portion of said junction area in a leaky condition to allow the passage of current therethrough; and current measuring means electrically connected between said electrode on said second region and said sweeping voltage means for measuring current flow through said light receiving junction area, said current flow being related to the position and intensity of said light on said light receiving junction area.

4. In combination, a light sensitive device including a plurality of semiconductive bodies arranged to provide a light sensitive surface, each of said bodies having a high resistivity base of one conductivity type with first and second regions of another conductivity type disposed on opposite faces thereof and forming first and second junction areas spaced apart by at least one minority carrier diffusion length; two spaced electrodes forming ohmic contacts to each of said first regions and being electrically interconnected in series; means for applying a steady state potential gradient across said first regions through said electrodes; single electrodes forming ohmic contact to each of said second regions and being electrically interconnected in parallel; means for applying a cycling, sweeping voltage between said ohmic contacts on said second regions and one of said ohmic contacts on each of said first regions, each cycle of said voltage sweeping from the minimum value to the maximum value of said potential gradient applied to said first regions and establishing inversely progressing incremental reverse biases on said junction areas, thus impeding the passage of current therethrough; one set of said junction areas being designed to receive light on at least portions thereof, said light maintaining said portions of said junction areas in a leaky condition and allowing the passage of current therethrough; and current measuring means connected to at least one of said second regions for measuring current flow through said junction areas contacted by said light, the intensity of said current flow being related to the position and intensity of said light on said light receiving junction areas.

5. In combination, a two-dimensional light position indicator including a semiconductor base of one conductivity type having disposed on opposite faces thereof first and second regions of another conductivity type forming first and second junction areas spaced apart by at least one minority carrier diffusion length; a first pair of ohmic electrodes contacting opposite edges of said first region; a second pair of ohmic electrodes contacting opposite edges of said second region, said first and second electrode pairs being in generally parallel planes and on edges of said regions substantially at right angles to each other; means for applying a steady state potential gradient and a cycling, sweeping voltage alternately to said first and second regions; said device being further characterized in that it is constructed and arranged to receive light on a portion thereof.

6. In combination, a two-dimensional light position indicator including a semiconductor base of one conductivity type having disposed on opposite faces thereof generally rectangular first and second regions of another conductivity type forming first and second junction areas spaced apart by at least one minority carrier diffusion length; a first pair of elongated ohmic electrodes contacting opposite edges of said first region; a second pair of elongated ohmic electrodes contacting opposite edges of said second region, said first and second electrode pairs being in parallel planes and substantially at right angles to each other; means for alternately applying a steady state potential gradient to one of said regions and a cycling, sweeping voltage to the other of said regions through said first and second electrode pairs, each cycle of said sweeping voltage varying from the minimum value to the maximum value of said steady state potential gradient and establishing inversely progressing incremental reverse biases on said junction areas, thus impeding the passage of current therethrough; said device being designed to receive light on one of said junction areas, said light maintaining at least a portion of said junction area in a leaky condition to allow the passage of current therethrough; and current measuring means electrically connected to at least one of said junction areas for measuring current flow through said light receiving junction area, the intensity of said current flow being related to the position and intensity of said light on said light receiving junction area.

7. In combination, a two dimension light spot position indicator including a semiconductor base of one conductivity type having disposed on opposite faces thereof generally rectangular first and second regions of another conductivity type forming first and second junction areas spaced apart by at least one minority carrier diffusion length; a first pair of ohmic electrodes contacting opposite edges of said first region; a second pair of ohmic electrodes contacting opposite edges of said second region, said first and second electrode pairs being in parallel planes and substantially at right angles to each other; a source of steady state voltage; a source of cycling, sweeping voltage; first switching means having on and off positions for connecting said steady state voltage source to one electrode of said first pair and said sweeping voltage source to one electrode of said second pair when in said on positions; second switching means having on and off positions for connecting said sweeping voltage source to one electrode of said first pair and said steady state voltage source to one electrode of said second pair when said first switching means is in said off position; third switching means for activating and deactivating said first and second switching means during alternate cycles of said sweeping voltage; said semiconductive portion of said indicator being constructed and arranged to receive light on one of said junction areas; and current measuring means connected between said switching means and said sweeping voltage source.

8. In combination, a two dimensional light position indicator including a semiconductor base of one conductivity type having disposed on opposite faces thereof generally rectangular first and second regions of another conductivity type forming first and second junction areas spaced apart by at least one minority carrier diffusion length; a first pair of elongated ohmic electrodes contacting opposite edges of said first region; a second pair of elongated ohmic electrodes contacting opposite edges of said second region, said first and second electrode pairs being in parallel planes and substantially at right angles to each other; two sets of switching circuits containing at least two transistors with input points of each set connected to form common input points, the output of each of said transistors being connected to one electrode to each of said paired electrodes; a steady state voltage source connected to the first of said transistors of each of said sets; a cycling, sweeping voltage source connected to the second of said transistors of each of said sets; a bistable flip flop circuit having first and second output points, each of said output points being connected to said common input points of said switching circuits, and an input point connected to said cycling, sweeping voltage source; said bistable circuit having two stable conditions of operation, said first condition activating the first of said switching circuits and deactivating the second on alternate cycles of said sweeping voltage source, said second condition activating said second of said switching circuits and deactivating said first switching circuit on alternate cycles of said sweeping voltage source; said semiconductive portion of said indicator being constructed and arranged to receive light on one of said junction areas; and current measuring means electrically connected between said sweeping voltage source and said transistor sets.

(References on following page)

References Cited by the Examiner

UNITED STATES PATENTS

| | | | |
|---|---|---|---|
| 2,812,446 | 11/57 | Pearson | 250—211 |
| 2,959,681 | 11/60 | Noyce | 250—211 |
| 3,005,107 | 10/61 | Weinstein | 250—211 |
| 3,028,500 | 4/62 | Wallmark | 250—211 |
| 3,102,959 | 9/63 | Deimer | 250—211 |

OTHER REFERENCES

Binggeli et al.: "Solid-State Panels: Will They Bring Flat-Display TV?" Electronics, June 29, 1962, volume 35, No. 6, pages 67 to 70.

RALPH G. NILSON, *Primary Examiner.*

ARCHIE R. BORCHELT, *Examiner.*